(12) United States Patent
Mueller

(10) Patent No.: US 7,151,229 B2
(45) Date of Patent: Dec. 19, 2006

(54) PRINTED CIRCUIT BOARD WITH IMPROVED COOLING OF ELECTRICAL COMPONENT

(75) Inventor: Marcus Mueller, Boblingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 274 days.

(21) Appl. No.: 10/814,041

(22) Filed: Mar. 31, 2004

(65) Prior Publication Data

US 2004/0228096 A1    Nov. 18, 2004

(30) Foreign Application Priority Data

May 13, 2003  (EP) .................................. 03101323

(51) Int. Cl.
*H05K 1/16* (2006.01)
(52) U.S. Cl. .................. 174/260; 174/252; 361/719
(58) Field of Classification Search ................ 174/260, 174/252, 261; 361/719, 720; 257/720
See application file for complete search history.

(56) References Cited

U.S. PATENT DOCUMENTS

| 3,484,935 | A | | 12/1969 | Burns ........................... 29/628 |
| 5,095,404 | A | * | 3/1992 | Chao ........................... 361/700 |
| 5,172,301 | A | * | 12/1992 | Schneider .................... 361/717 |
| 5,285,352 | A | * | 2/1994 | Pastore et al. .............. 361/707 |
| 5,920,458 | A | * | 7/1999 | Azar ........................... 361/704 |
| 6,000,125 | A | * | 12/1999 | Kang ........................... 29/832 |
| 6,219,243 | B1 | | 4/2001 | Ma et al. ..................... 361/704 |
| 6,411,516 | B1 | | 6/2002 | Palumbo et al. ............ 361/704 |

FOREIGN PATENT DOCUMENTS

| DE | 42 20 966 | 1/1994 |
| DE | 199 16 010 | 4/2000 |
| EP | 0 907 307 | 4/1999 |
| WO | WO 01/01738 | 1/2001 |
| WO | WO 02/054477 | 7/2002 |

* cited by examiner

*Primary Examiner*—Ishwar (I. B.) Patel
(74) *Attorney, Agent, or Firm*—Ohlandt, Greeley, Ruggiero & Perle, L.L.P.

(57) ABSTRACT

The present invention relates to improved cooling of an electronic component loaded to a Printed Circuit Board, wherein the PCB comprises at its upper side at least one electronic component, and at least one Heat Conducting Member inserted into a through-hole of the PCB, wherein the HCM extends from the upper side to the lower side of the PCB and has a thermal contact to the component.

6 Claims, 6 Drawing Sheets

PRINTED CIRCUIT BOARD WITH IMPROVED COOLING OF ELECTRICAL COMPONENT

BACKGROUND OF THE INVENTION

The present invention relates to printed circuit boards (PCB), which usually are loaded with numerous electrical components e.g. integrated circuits (IC). During operation these components generate heat, which has to be removed from the components in order to improve performance and extend the lifetime of the components. Current electronic devices are usually provided with several PCBs and comprise a cooling device providing a heat sink for removing the heat from the critical components.

SUMMARY OF THE INVENTION

It is an object of the present invention to provide an improved way of cooling an electronic component mounted to a PCB. The object is solved by the independent claims. Preferred embodiments are shown by the dependent claims.

The invention suggests a heat conductive member (HCM) for each component to be cooled, wherein the HCM is arranged in a through-hole, which is provided in the PCB, wherein said HCM is thermally contacted with the component and extends within the through-hole from the upper side of the PCB to the lower side of the PCB. Therefore, the HCM transmits heat from the component, which is arranged at the upper side of the PCB, to the lower side of the PCB by locally improving the thermal conductivity of the PCB. At the lower side of the PCB the HCM can be contacted with an appropriate heat sink, e.g. a cooling device. Thus, the effectiveness of cooling the component can obviously be improved. The HCM is made of an appropriate thermally conductive material, e.g. brass, copper or a copper-alloy. The HCM comprises a substantially planar top portion and tapered or recessed bottom portion so that substantially only the areas turned away from the top side of the HCM are deformed during a force fitting of the HCM into the through-hole.

In case a heat sink is used, the invention allows providing almost direct contact with the respective components, thus providing improved effectiveness of such cooling.

According to a preferred embodiment, the through-hole is positioned centrally underneath the component to be cooled, wherein a topside of the HCM is directly thermally contacted with a bottom side of the component. By directly contacting the component to the HCM heat losses in the thermal path can be reduced. It should be clear that between the bottom side of the component and the topside of the HCM any appropriate thermally conductive contacting substances like a solder can be arranged in order to improve the thermal contact in-between HCM and component. Preferably the bottom side of the component is provided with a heat-emitting surface, e.g. a metallic surface, improving the heat exchange between the component and the HCM.

To improve the effectiveness of the thermal flow the topside of the HCM may be plainly aligned with the upper side of the PCB and/or a bottom side of the HCM may be plainly aligned with the lower side of the PCB. With help of these features the direct contact and thus the thermal conductivity between the topside of the HCM and the bottom side of the component and/or between the bottom side of the HCM and a topside of a heat sink can be improved. These features also simplify serial production of the PCB and of electrical devices provided with such PCBs.

According to manufacturing tolerances the thickness of the PCB, which consists usually of multiple layers, may vary in a relatively wide tolerance range. To provide a substantially exact planar alignment between the top side of the HCM and the upper side of the PCB and between the bottom side of the HCM and the lower side of the PCB a preferred manufacturing method proposes to provide the HCM before it is force fitted into the through-hole with an origin shape, in which the dimension between the top side and the bottom side of the HCM is larger than the thickness of the PCB. Thus, the force fitting can be performed to press the HCM into the through-hole as long as the respective sides of HCM and PCB are aligned to each other.

BRIEF DESCRIPTION OF THE DRAWINGS

Other objects and many of the attendant advantages of the present invention will be readily appreciated and become better understood by reference to the following detailed description when considered in connection with the accompanying drawings. Features that are substantially or functionally equal or similar will be referred to with the same reference sign(s).

DETAILED DESCRIPTION OF THE INVENTION

Figure 1:
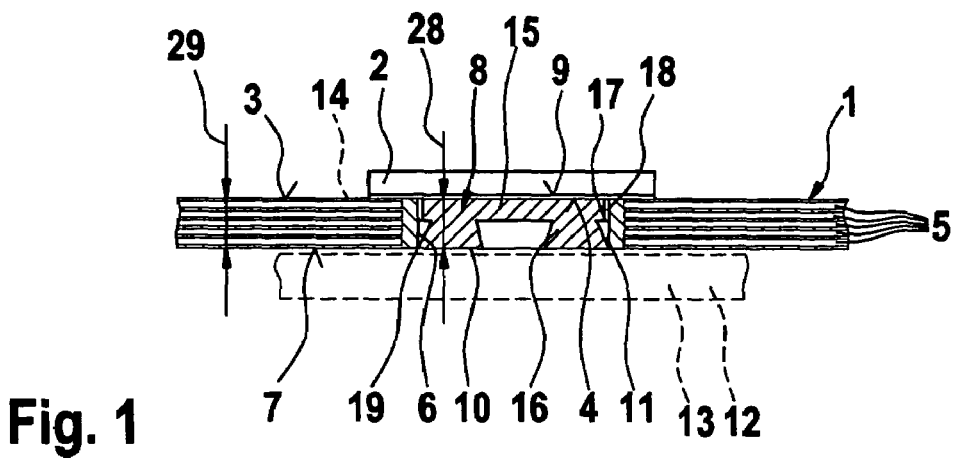
FIGS. 1 to 3: depict cross sections through a PCB according to the invention in an area provided with a component to be cooled at different configurations.
Figure 2:
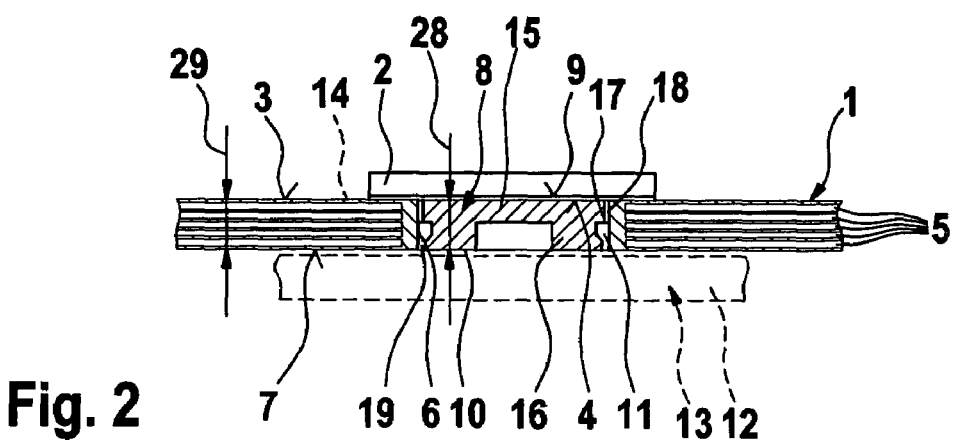
Figure 3:
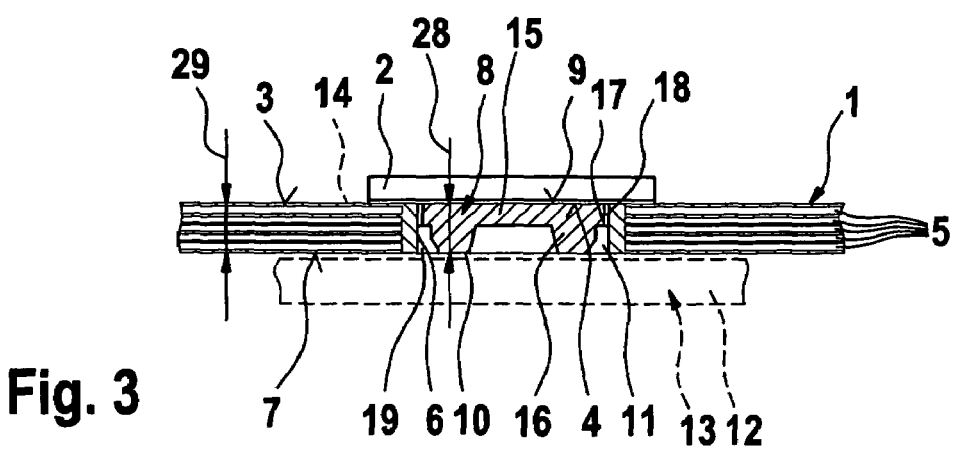

Referring to FIGS. 1 to 3 a Printed Circuit Board 1 (PCB 1) according to the invention is provided with at least one electrical component 2. This component 2 generates heat, when it is in an operational mode. The component 2 e.g. can be a microprocessor or another arbitrary IC. The PCB 1 has an upper side 3 on which the component 2 is arranged with its bottom side 4 down. This bottom side 4 of the component 2 is preferably provided with a heat-emitting surface and e.g. is made of an appropriate metal or metal alloy. This heat-emitting surface is preferably directly connected to a semiconductor arranged inside of a housing of the component 2.

The PCB 1 consists of several layers 5 of a suitable substrate material, thus the PCB 1 has a multilayer design. These layers 5 are usually provided with printed circuits. Underneath the component 2 the PCB 1 is provided with a through-hole 6 extending from the upper side 3 to a lower side 7 of the PCB 1. In this through-hole 6 is—according to the invention—inserted a Heat Conductive Member 8 (HCM 8) having a topside 9 and a bottom side 10. The HCM 8 is with its top side 9 thermally contacted with the bottom side 4 of the component 2 (e.g. by a standard soldering process) and extends within the through-hole 6 form the upper side 3 of the PCB 1 to the lower side 7 of the PCB 1. The HCM 8 is made of a material that is especially appropriate for heat transmission e.g. copper or a copper alloy.

When the PCB 1 is provided with a heat sink 12 of a cooling device 13 (both symbolized by dashed lines) the heat sink 12 is arranged at the lower side 7 of the PCB 1. Preferably, the heat sink 12 with its topside 14 directly contacts the lower side 7 of the PCB 1. Since the HCM 8 extends to the lower side 7 of the PCB 1 it thermally contacts the topside 14 of the heat sink 12 with its bottom side 10. Therefore, the HCM 8 provides a very effective heat-transmitting path directly transporting heat from the component 2 by means of the HCM 8 to the heat sink 12. With help of the HCM 8 the cooling of the component 2 can be highly improved. Thus, the performance and the lifetime of the component 2 can be improved accordingly.

It may be suitable to arrange any appropriate thermally conductive contacting substance like a solder between the bottom side 4 of the component 2 and the top side 9 of the HCM 8 and, respectively, between the bottom side 10 of the HCM 8 and the top side 14 of the heat sink 12 in order to improve the direct thermal contact between HCM 8 and component 2 and, respectively, between HCM 8 and heat sink 12.

Referring to the FIGS. 1 to 3 (see also FIGS. 4 to 8) the HCM 8 is provided with a top portion 15 and a bottom portion 16. The top portion 15 has a centrally closed disc shape and comprises the topside 9 of the HCM 8. Therefore, the topside 9 of the HCM 8 has a large surface for improved contact with the bottom side 4 of the component 2. At an outer edge 17 the top portion 15 is provided with several projections 18 which radially extend from the outer edge 17. These projections 18 can be provided as a tooth system or as a knurl. When the HCM 8 is inserted into the through-hole 6 the projections 18 penetrate into an inner wall 19 of the PCB 1, said inner wall 19 enclosing the through-hole 6. Therefore, the projections 18 affix the HCM 8 to the PCB 1.

The bottom portion 16 has a centrally open ring shape and comprises the bottom side 10 of the HCM 8. The bottom portion 16 extends from the top portion 15. Before inserting the HCM 8 into the through-hole 6 the HCM 8 has an origin shape shown in FIGS. 4 to 6. In this origin shape the bottom portion 16 has a truncated conical profile, which tapers with the distance to the top portion 15.

After insertion of the HCM 8 into the through-hole 6 the bottom portion 16 is plastically deformed.

The HCM 8 preferably has a substantially rotationally symmetrical shape. Consequently, the through-hole 6 has a cylindrical shape. In a convenient embodiment the HCM 8 is made as a one-piece element.

With respect to the FIGS. 4 to 8 a preferred method for manufacturing the PCB 1 is described in the following.

Figure 4:
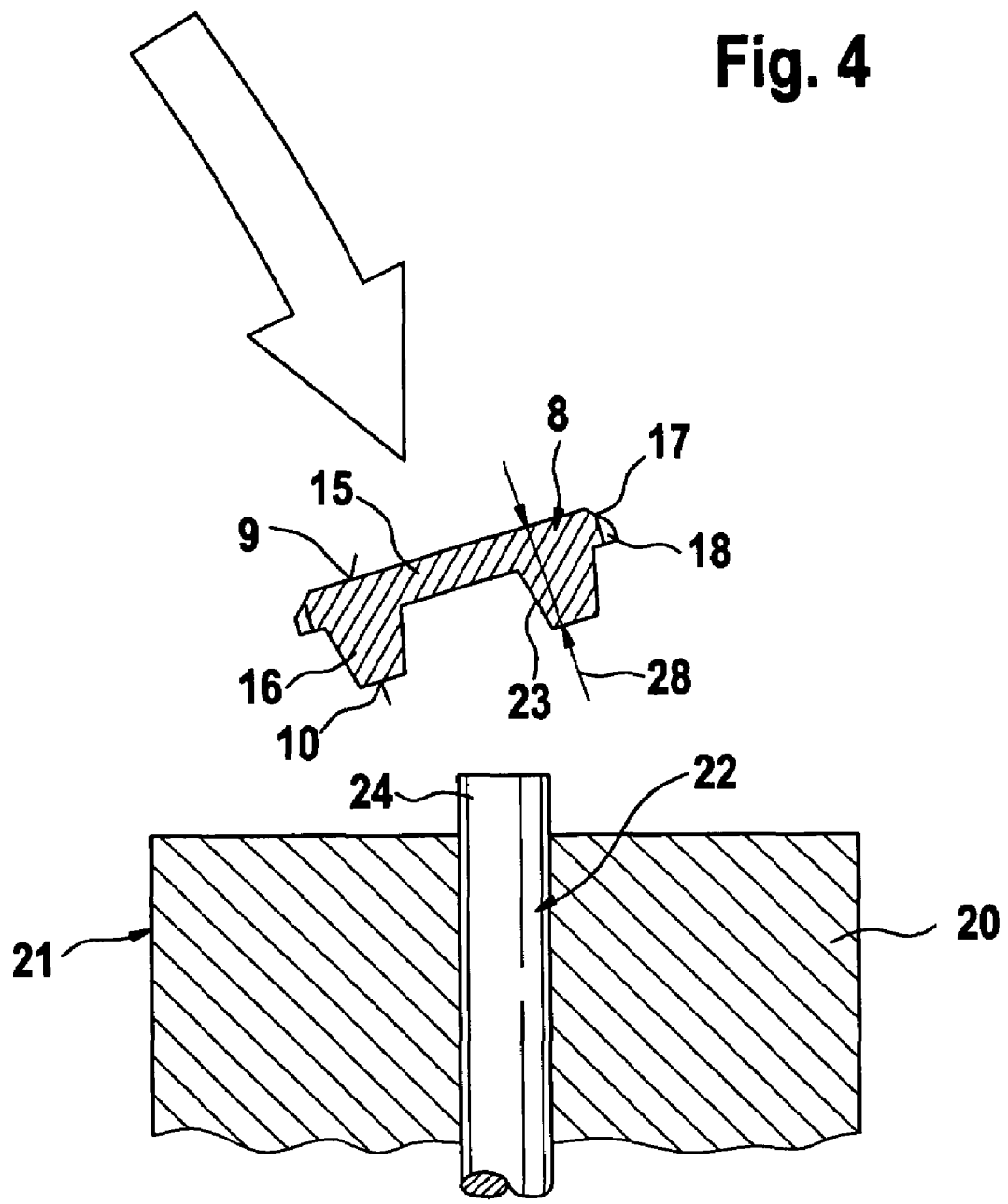
FIGS. 4 to 8: depict cross sections as shown in FIGS. 1 to 3 at different manufacturing states.

According to FIG. 4 the HCM 8 having its origin shape is positioned on a first pressing tool 20 of a pressing device 21. The first pressing tool 20 preferably has a planar surface and is provided with a centering mandrill 22, which is longitudinally adjustable in the center of the first pressing tool 20. In the state of FIG. 4 the centering mandrill 22 projects from the first pressing tool 20. The HCM 8 is arranged on the first pressing tool 20 such that the centering mandrill 22 penetrates into a central cavity 23 of the HCM 8, said cavity 23 is encircled by the ring-shaped bottom portion 16. The centering mandrill 22 urges the HCM 8 into a predetermined centered position as could be seen in FIG. 5. Is should be clear that a top 24 of the centering mandrill 22 can have any appropriate shape supporting the centering function. E.g. the top 24 also can have a truncated conical and tapering shape.

Figure 5:
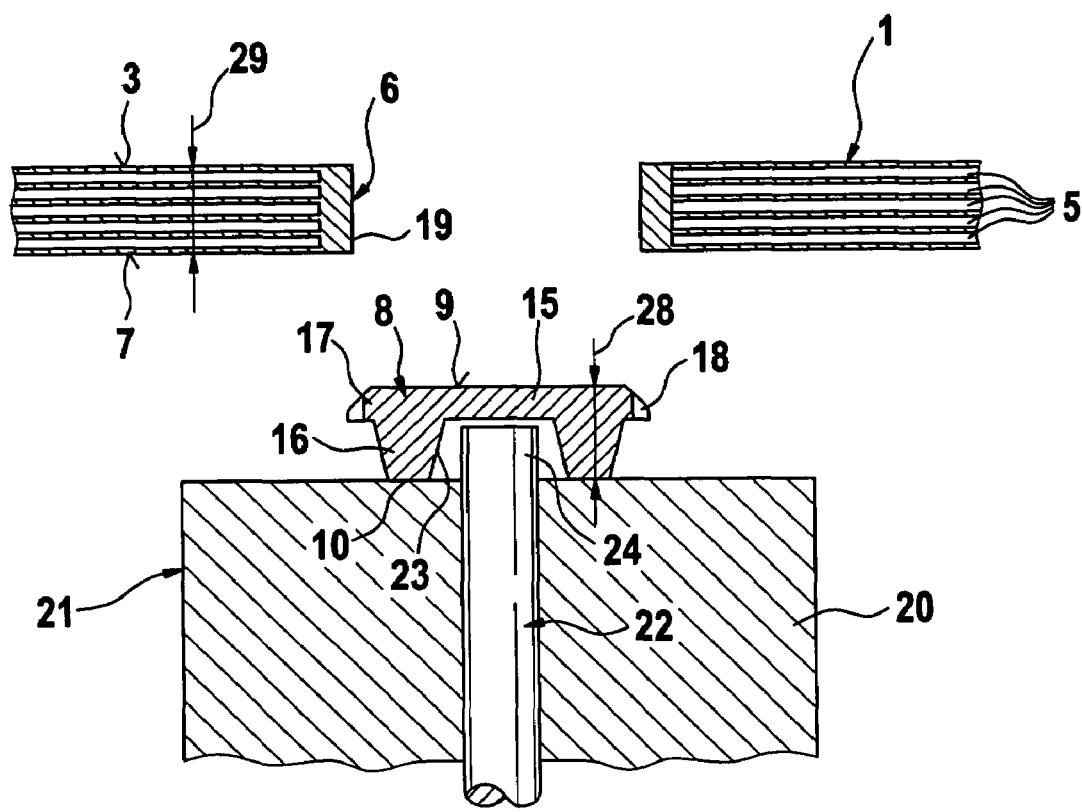
Figure 6:
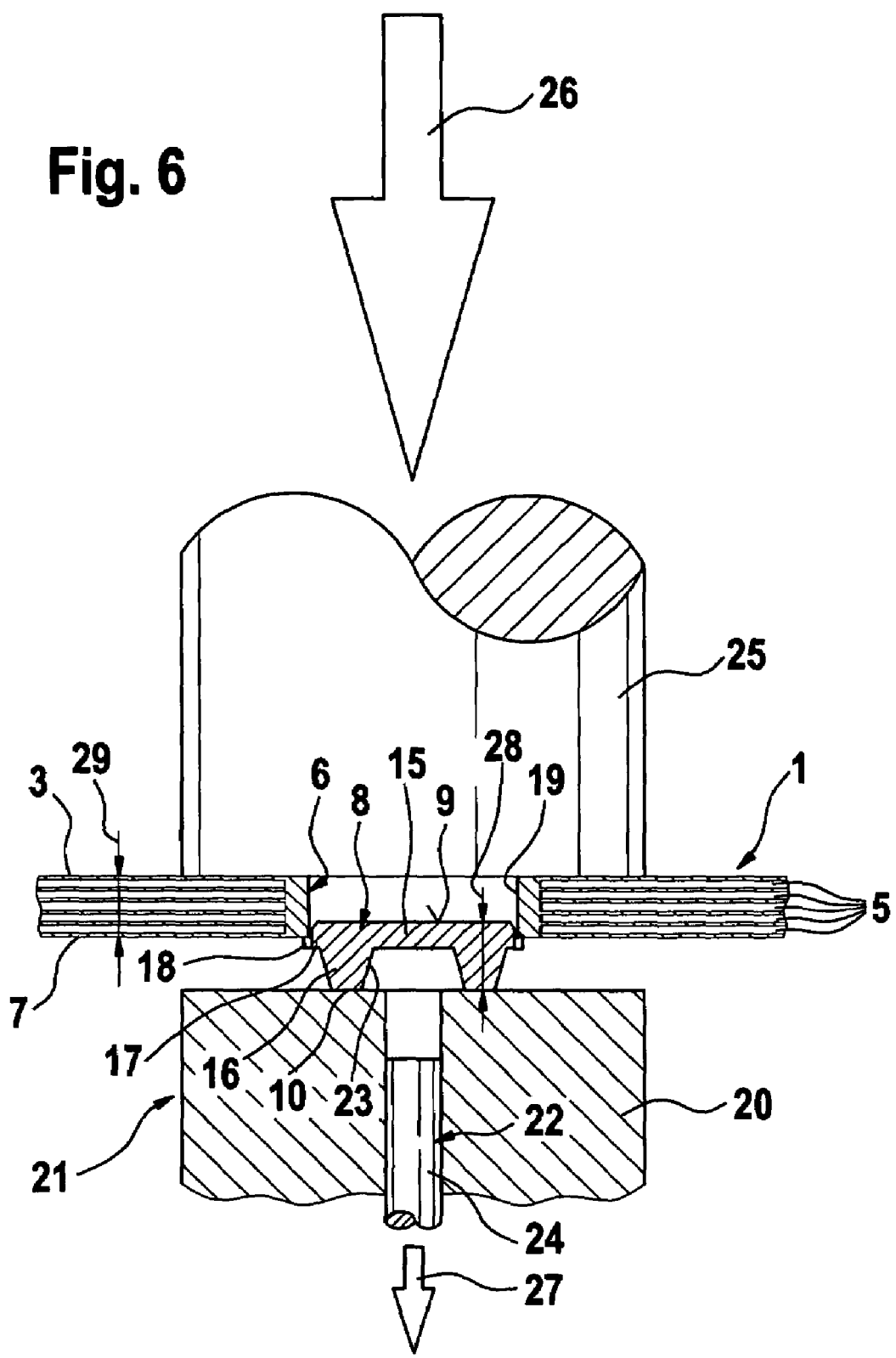

After positioning the HCM 8 relative to the first pressing tool 20 the PCB 1 already provided with the through-hole 6 is positioned relative to the first pressing tool 20, see FIG. 5, wherein the PCB 1 has its lower side 7 turned to the HCM 8 and to the first pressing tool 20. It is clear that positioning of PCB 1 and HCM 8 can be performed in the other order or simultaneously. At the end of this positioning procedure the HCM 8 is aligned with the through-hole 6.

After aligning the HCM 8 and the through-hole 6 the HCM 8 becomes press or force fitted into the through-hole 6 by means of pressing forces. To this aim the pressing device is provided with a second pressing tool 25 co-operating with the upper side 3 of the PCB 1, see FIG. 6. The second pressing tool 25 preferably has a planar surface, too, which extends parallel to the surface of the first pressing tool 20. The pressing tools 20 and 25 are then pressed towards each other according to an arrow 26. The pressing direction extends perpendicular to the planar surfaces of the pressing tools 20, 25. Simultaneously the centering mandrill 22 gets retracted into the first pressing tool 20 according to an arrow 27. As can lucidly be seen in FIG. 6 the outer diameter of the top portion 15 of the HCM 8 is due to the projections 18 larger than the inner diameter of the through-hole 6. Therefore, the projections 18 penetrate radially into the inner wall 19 of the through-hole 6, while the HCM 6 is pressed into the through-hole 6. In doing so the projection 18 deform the inner wall 19 and act like barbs intensively anchoring the HCM 8 in the PCB 1.

According to a preferred embodiment of the present invention the origin shape of the HCM 8 is chosen in a way that a thickness 28 of the HCM 8 is larger than a thickness 29 of the PCB 1, see FIG. 5. The thickness 28 of the HCM 8 is the distance between its topside 9 and its bottom side 10. Accordingly, the thickness 29 of the PCB 1 is the distance between its upper side 3 and its lower side 7. As the PCB 1 is of a multilayer design the thickness 29 of the PCB 1 naturally varies within a relatively large tolerance range comprising a maximum value and a minimum value for the thickness or distance 29. Preferably, the distance or thickness 28 of the HCM 8 is in the origin shape of the HCM 8 larger than the maximum value of the aforementioned tolerance interval.

Figure 7:
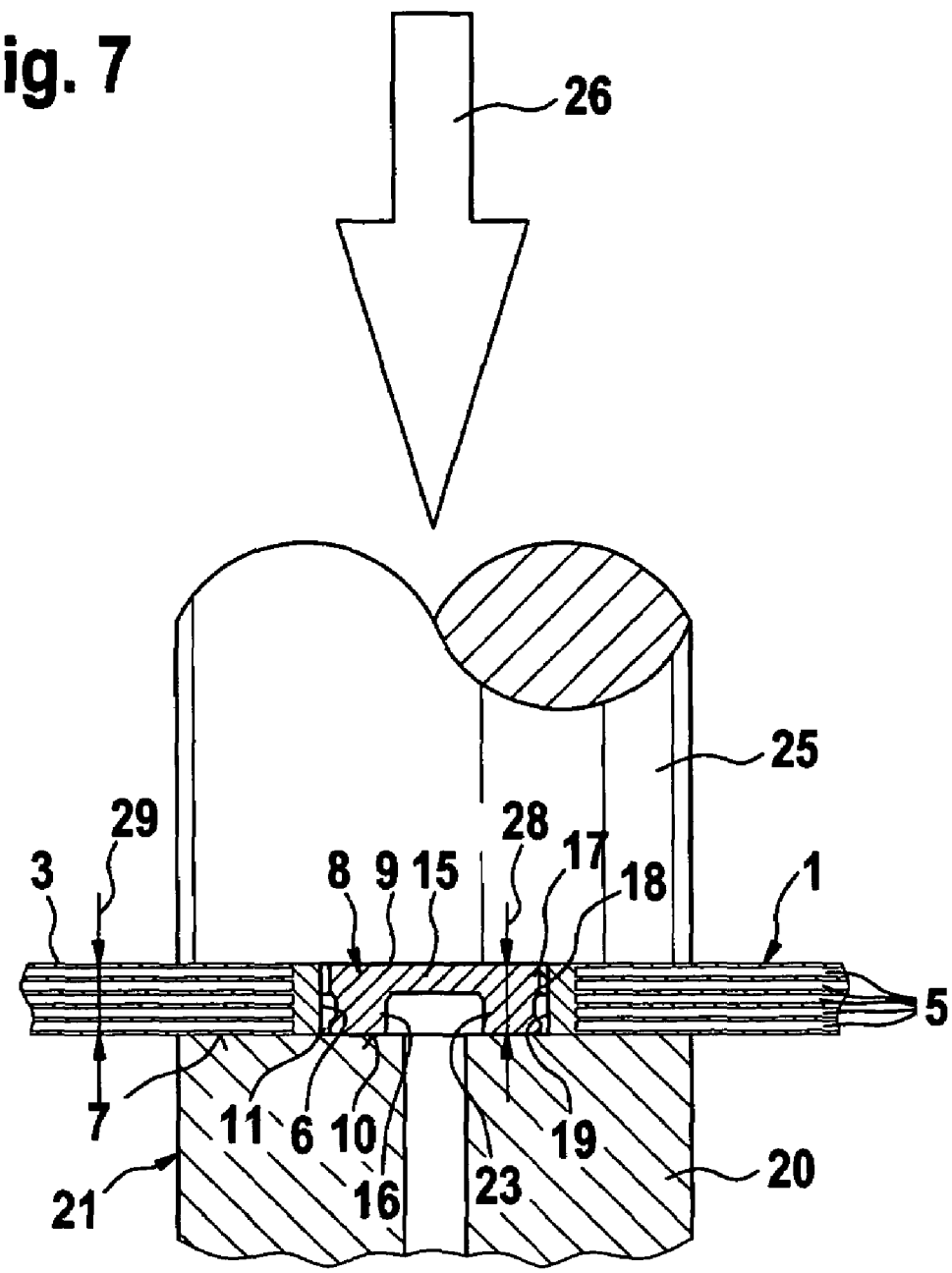

As can be seen in FIG. 7 the pressing tools 20, 25 are pressed together until the top side 9 of the HCM 8 abuts against the second pressing tool 25. Since the thickness 28 of the HCM 8 at this state of the procedure still is larger than the thickness 29 of the PCB 1 the progressing movement of the pressing tools 20, 25 deforms the HCM 8 and creates the final shape of the HCM 8. The movement of the pressing tools 20, 25 is in progress as long as both pressing tools 20, 25 are in contact with the respective sides 3, 7 of the PCB 1. Consequently, the pressing tools 20, 25 plastically deform the HCM 8. After the pressing process the HCM 8 has the same thickness 29 as the PCB 1. Therefore, the topside 9 of the HCM 8 is planarly aligned with the upper side 3 of the PCB 1 and the bottom side 10 of the HCM 8 is planarly aligned with the lower side 7 of the PCB 1. By this the thickness dimension of the HCM 8 is calibrated to the thickness of the PCB 1 independent of the thickness value of the PCB 1 inside its tolerance range.

The closed disc-shaped top portion 15 is very solid and effects that the plane topside 9 of the HCM 8 is not or essentially not deformed during the force fitting of the HCM 8 into the through-hole 6. The truncated conical and tapering profile of the open ring-shaped bottom portion 16 effects that the areas turned away from the top side 9 of the HCM 8 are first to be deformed and the areas near the top portion get not or hardly deformed.

Figure 8:
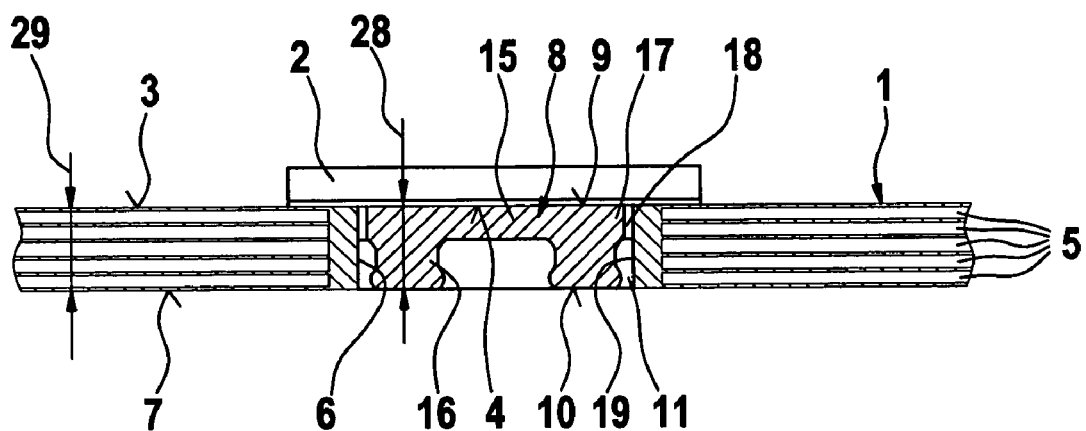

As can be seen clearly in FIG. 7 and 8 the HCM 8 is designed in a way that after force fitting the HCM 8 into the through-hole 6 a ring-shaped radial gap 11 is provided between the bottom portion 16 and the inner wall 19. According to this design feature damaging of the PCB 1 can be prevented while performing the force fitting of the HCM 8 into the through-hole 6. The force fitting of the HCM 8 can be performed by controlling the movement of the pressing tools 20, 25. In a preferred embodiment the press fitting of the HCM 8 is force controlled, i.e. the pressing tools 20, 25 are pressed together with a predetermined constant pressing force high enough for plastically deforming the HCM 8 and too low for damaging the PCB 1. Therefore, the controlling is independent from the varying thickness 29 of the PCB 1.

After completing the force fitting of the HCM 8 into the through-hole 6 the pressing tools 20, 25 get retracted and the PCB 1 can be removed out of the pressing device 21. Afterwards the PCB 2 can be provided with the component 2, wherein an additional thermally contacting substance may be applied between HCM 8 and component 2 to improve plane contact along large surfaces.

Although the FIGS. 4 to 8 only show the insertion of a single HCM 8 into its respective through-hole 6 it is clear that the insertion process can be performed such that at least two or in particular all HCMs 8 of a specific PCB 1 can be inserted simultaneously into their respective through-holes 6.

FIGS. 1 to 3 depict three different configurations, which may occur by inserting the HCM 8 into the through-hole 6 of the PCB 1. In FIG. 1 the PCB 1 shows the minimum value for its thickness 29. Consequently, the force fitting of the HCM 8 leads to a maximum deformation of the HCM 8 or its bottom portion 16, respectively. As it can be seen, the dimensions of the origin shape of the HCM 8 are preferably chosen in a way that even in this border case the gap 11 can be provided.

FIG. 3 shows the other border case, wherein the thickness 29 of the PCB 1 has its maximum value. Thus, the force fitting of the HCM 8 leads to a minimum deformation of the bottom portion 16 of the HCM 8. Preferably, the dimensions of the origin shape of the HCM 8 are chosen such that even in this border case still occurs a deformation of the HCM 8.

Finally FIG. 2 shows a configuration between the border cases of FIGS. 1 and 3 leading to a medium deformation of the HCM 8 during the force fitting procedure.

The invention claimed is:

1. A printed circuit board (PCB) having a through-hole between an upper side and a lower side of the PCB, comprising:
   at least one electronic component attached to the upper side,
   at least one heat-conducting member (HCM) for inserting into the through-hole, extending from the upper side to the lower side, and being thermally coupled with said electronic component, and
   the HCM comprising a substantially planar, disc-shaped top portion and tapered or recessed, ring-shaped bottom portion, wherein said top portion is thermally coupled with said electronic component and wherein said top portion comprises several projections radially extending from an outer edge of the top portion, said projections affixed the HCM to the PCB by penetrating into an inner wall enclosing the through-hole, and wherein the bottom portion has a final shape resulting from plastically deforming an origin shape of the bottom portion by pressing the HCM substantially perpendicular to the top portion via a planar pressing tools.

2. The PCB according to claim 1, wherein:
   the through-hole is arranged substantially centrally underneath the component, and
   a top side of the HCM is directly thermally coupled with a bottom side of the component.

3. The PCB according to claim 1, wherein between the bottom portion and an inner wall enclosing the through-hole a ring shaped gap is provided.

4. The PCB according to claim 1, wherein said PCB comprises at least one feature from the group consisting of:
   a top side of the HCM is disposed on the same plane as said upper side of the PCB, and
   a bottom side of the HCM is disposed on the same plane as said lower side of the PCB.

5. The PCB according to claim 1, wherein the HCM has a substantially rotationally symmetrical shape.

6. The PCB according to claim 1, wherein the HCM is thermally contacted with at least one of a heat sink and a cooling device preferably attached to the lower side of the PCB.

* * * * *